(12) United States Patent
Aoki

(10) Patent No.: US 6,912,682 B1
(45) Date of Patent: Jun. 28, 2005

(54) SIGNAL PROCESSOR FOR CORRECTING AND DETECTING ERRORS

(75) Inventor: Toru Aoki, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 195 days.

(21) Appl. No.: 09/831,505

(22) PCT Filed: Sep. 8, 2000

(86) PCT No.: PCT/JP00/06122

§ 371 (c)(1),
(2), (4) Date: Aug. 1, 2001

(87) PCT Pub. No.: WO01/20607

PCT Pub. Date: Mar. 22, 2001

(30) Foreign Application Priority Data

Sep. 10, 1999 (JP) .......................................... 11-256736

(51) Int. Cl.[7] .............................. G11C 29/00; G11B 5/09
(52) U.S. Cl. ........................ 714/764; 714/769; 360/48; 360/53
(58) Field of Search ................................ 714/784, 785, 714/770, 769, 764, 718; 360/48, 53; 369/124; 711/157, 167

(56) References Cited

U.S. PATENT DOCUMENTS

| | | |
|---|---|---|
| 6,003,151 A | 12/1999 | Chuang |
| 6,088,775 A | 7/2000 | Inoue et al. |
| 6,158,039 A | 12/2000 | Cho et al. |
| 6,256,717 B1 | 7/2001 | Inoue et al. |
| 6,266,712 B1 * | 7/2001 | Henrichs ........................ 710/8 |
| 6,600,779 B1 * | 7/2003 | Sawada et al. .............. 375/233 |

FOREIGN PATENT DOCUMENTS

| | | |
|---|---|---|
| CN | 1188964 A | 7/1998 |
| EP | 0939403 A2 | 9/1999 |
| JP | 62-119773 | 6/1987 |
| JP | 63-272226 | 11/1988 |
| JP | 6-260943 | 9/1994 |
| JP | 9-91889 | 4/1997 |
| JP | 10-124995 | 5/1998 |
| KR | 1998-0004785 | 3/1998 |
| KR | 1998-065723 | 10/1998 |

OTHER PUBLICATIONS

Trellis–Based Postprocessing of Viterbi Decisions for Noise Decorrelation and Compensation of Nonlinear Distortion (with application to magnetic recording channels) Agazzi, et al. 1996 IEEE ICC, vol.: 1, Jun. 23–27 1996 Page(s): 566–572 vol. 1.*

Patent Abstracts of Japan, vol. 1998, No. 10, Aug. 31, 1998 & JP 10 126279 A (Matsushita Electric Ind Co Ltd), May 15, 1998, abstract.

(Continued)

*Primary Examiner*—Albert Decady
*Assistant Examiner*—Cynthia Britt
(74) *Attorney, Agent, or Firm*—Wenderoth, Lind & Ponack, L.L.P.

(57) ABSTRACT

A signal processor performs error correction on data which has been subjected to predetermined signal processing, for each predetermined block unit, by an error correction block, in parallel with an operation of sequentially storing the data in a cache memory. Then, error detection is performed on the data for each predetermined block unit by a descrambling/error detection block, and the data is stored in a buffer memory. Based on the results of the error detection and the error correction, when there exists some error in the data, the data with the error, which is stored in the buffer memory, is read out to be subjected to error correction again. When there is no error, the data corresponding to one block and stored in the buffer memory is transmitted to a host computer without performing error correction again.

3 Claims, 6 Drawing Sheets

OTHER PUBLICATIONS

Patent Abstract of Japan, vol. 1997, No. 08, Aug. 29, 1997 & JP 09 091889 A (Matsushita Electric Ind Co Ltd), Apr. 4, 1997, abstract.

Patent Abstracts of Japan, vol. 1997, No. 09, Sep. 30, 1997 & JP 09 139026 A (Mitsubishi Electric Corp), May 27, 1997, abstract.

Patent Abstracts of Japan, vol. 1999, No. 11, Sep. 30, 1999 & JP 11 168392 A (Toshiba Corp), Jun. 22, 1999.

* cited by examiner

SIGNAL PROCESSOR FOR CORRECTING AND DETECTING ERRORS

TECHNICAL FIELD

The present invention relates to a signal processor for detecting and correcting errors in data read from a recording medium.

BACKGROUND ART

In recent years, high quality and high speed are demanded of a DVD-ROM, which has become widespread as a digital memory, to increase the reliability of data read from a DVD disk. With the demand, a signal processor for correcting errors in the disk is required to have rapid processing means, and it is aimed at realization of high-speed data processing.

A conventional CD-ROM signal processor performs error correction by a predetermined number of times. Further, the CD-ROM signal processor writes inputted data in a buffer memory and, simultaneously, detects errors in the data by using CRC (Cyclic Redundancy Check). Based on the result of CRC, when the data is decided as "error-free data", the signal processor reduces the predetermined number of error corrections.

In the case of DVD-ROM data, however, since inputted data is not previously subjected to error correction in contrast to the CD-ROM data, the error rate is higher in the DVD-ROM data than in the CD-ROM data. Therefore, when the DVD-ROM data is subjected to CRC, the result of CRC is, in most cases, that there are errors in the DVD-ROM data.

Figure 6:
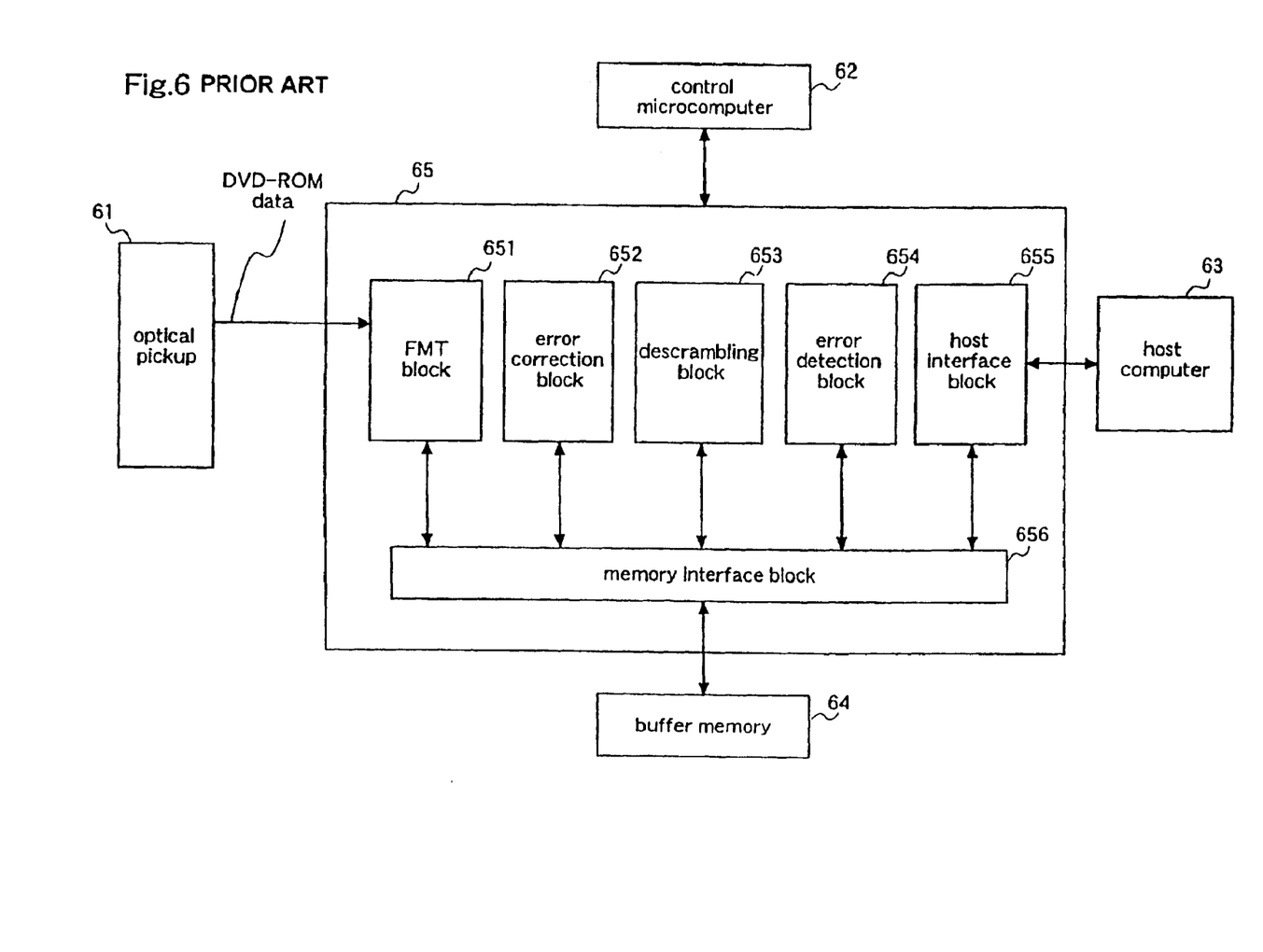
FIG. 6 is a block diagram illustrating the structure of the conventional DVD-ROM signal processor.

FIG. 6 is a block diagram illustrating the structure of a conventional DVD-ROM signal processor.

In FIG. 6, a DVD-ROM signal processor 65 receives DVD-ROM digital signal data (hereinafter referred to as "data") which is read by an optical pickup 61, and outputs the data after error correction to a host computer 63. The DVD-ROM signal processor 65 is under control of a control microcomputer 62, and is connected with a buffer memory 64 which stores data.

To be specific, the DVD-ROM signal processor 65 is provided with an FMT block 651 for capturing the DVD-ROM data outputted from the optical pickup 61, and storing it in the buffer memory 64; an error correction block 652 for correcting errors in the data stored in the buffer memory 64; a descrambling block 653 for descrambling the scrambled data; an error detection block 654 for detecting errors in the data after error correction, which data is stored in the buffer memory 64; a host interface block 655 for transmitting error-free data to the host computer, based on the result of the error detection by the error detection block 654; and a memory interface block 656 for controlling the processing between the DVD-ROM signal processor 65 and the buffer memory 64.

The operation of the conventional DVD-ROM signal processor so constructed will be described with reference to FIGS. 4 and 6.

Figure 4:
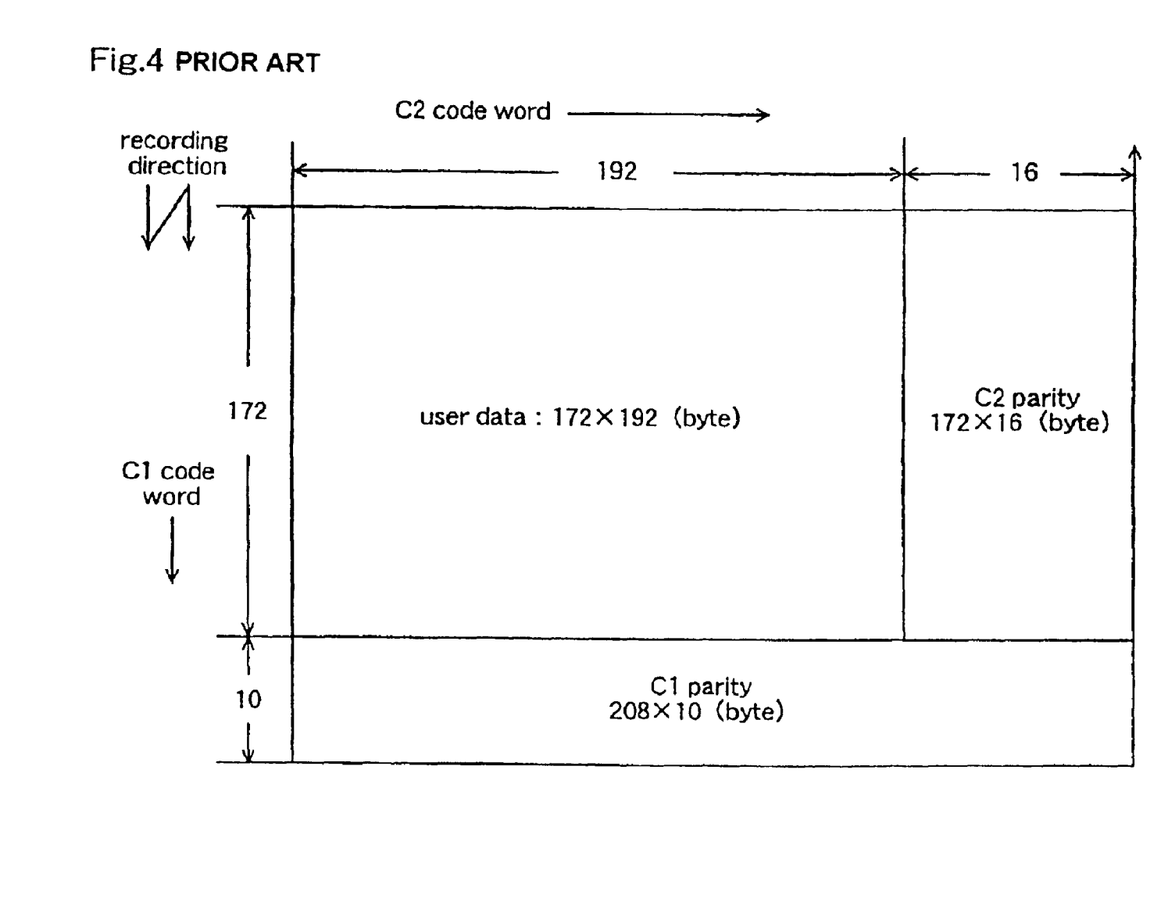
FIG. 4 is a diagram illustrating the data format constituting one ECC block.

FIG. 4 is a diagram illustrating the data format constituting one ECC block.

As shown in FIG. 4, the logical format of the DVD-ROM data outputted from the optical pickup 61 is constituted with 182×208 bytes as one ECC (Error Correcting Code) block.

First of all, the data read by the optical pickup 61 forms one component unit with 182 bytes as a C1 code word. The C1 code word is composed of 172 bytes of user data and 10 bytes of C1 parity. One ECC block is composed of plural C1 code words and plural C2 code words, each C2 code word comprising 208 bytes obtained by collecting one byte from each C1 code word. Each C2 code word is composed of 192 bytes of user data and 16 bytes of C2 parity. The DVD-ROM data has been scrambled in advance.

In FIG. 6, the FMT block 651 converts the DVD-ROM serial data outputted from the optical pickup 61 into parallel data (serial to parallel conversion), subjects the converted data to demodulation and sync detection, and writes the parallel data in the buffer memory 64 through the memory interface block 656.

The error correction block 652 reads the DVD-ROM data written in the buffer memory 64, through the memory interface block 656, performs syndrome calculation on the C1 code words and the C2 code words shown in FIG. 4, and calculates the error position and the error pattern by using the result of the syndrome calculation. Based on the result of the syndrome calculation, the error correction block 652 terminates the error correction when the data has no error. However, when the data has some error, the error correction block 652 reads the error data stored in the buffer memory 64, through the memory interface block 656, performs error correction on the error data, and writes the corrected data over the address of the error data stored in the buffer memory 64, through the memory interface block 656.

The descrambling block 653 reads the DVD-ROM data which has been subjected to error correction and is stored in the buffer memory 64, through the memory interface block 656, descrambles the data according to a predetermined method, and writes the data in the buffer memory 64 through the memory interface block 656.

The error detection block 654 reads the DVD-ROM data which has been descrambled and is stored in the buffer memory 64, through the memory interface block 656, and detects errors in the read data by performing a predetermined calculation.

The host interface block 655 transmits, to the host computer 63, the DVD-ROM data which has been decided as "error-free data" in both of the error correction block 652 and the error detection block 654.

Each of the above-mentioned blocks is constructed so as to operate at a predetermined timing according to an instruction from the control microcomputer 62.

In the conventional DVD-ROM signal processor, however, when the DVD-ROM data is subjected to error correction, the following operations are performed on the buffer memory 64: writing of data from the FMT block 651, reading and writing of data from the error correction block 652, reading and writing of data from the descrambling block 653, reading of data from the error detection block 654, and reading of data from the host interface block 655. That is, since reading and writing of data are performed frequently through the buffer memory 64, the memory band width is pressed and, therefore, the signal processor cannot perform high-speed access and higher-speed data processing.

The present invention is made to solve the above-described problem, and it is an object of the present invention to provide a signal processor which can reduce the number of memory accesses by reducing the number of error corrections, thereby realizing higher-speed data processing.

SUMMARY OF THE INVENTION

A signal processor according to a first aspect of the present invention is a signal processor for subjecting data read from a recording medium to predetermined digital signal processing, and subjecting the data, which has been subjected to the predetermined digital signal processing, to error correction for each predetermined error correction block. This signal processor comprises: memory means for sequentially storing the data which has been subjected to the predetermined digital signal processing; error correction means for subjecting the data, which has been subjected to the predetermined digital signal processing, to error correction for each predetermined error correction block; descrambling/error detection means for descrambling the data which has been subjected to the error correction, and detecting errors in the data after the descrambling; and control means for transmitting error-free data to a display unit when there is no error in the data which has been subjected to the error detection.

In the signal processor so constructed, the number of data error corrections can be reduced, whereby reduced power consumption of the device itself can be achieved. Further, since the number of memory accesses to the memory means for error correction can be reduced, the access right to the memory means can be assigned to another block, whereby high-speed processing of the signal processor is realized.

According to the present invention, in the signal processor described in the first aspect, the error correction means comprises: a syndrome calculator for calculating a syndrome of the data which has been subjected to the predetermined digital signal processing; an error position/pattern calculator for calculating the error position and the error pattern after the syndrome calculation; error correction result holding means for holding information as to whether or not the data detected by the error position/pattern calculator is error-correctable; data correction means for correcting errors in the data on the basis of the result of the syndrome calculation; and number-of-error-correction control means for controlling the number of error corrections.

In the signal processor so constructed, the time required for memory access to the memory means can be reduced by reducing the number of error corrections and, furthermore, speedup of data processing is achieved.

According to the present invention, in the signal processor described in the first aspect, the descrambling/error detection means comprises: descrambling means for descrambling the data which has been corrected by the error correction means; error detection means for detecting errors in the descrambled data; and error detection result holding means for holding the result of the error detection as to whether there is any error in the data which has been subjected to the error detection.

In the signal processor so constructed, based on the result of error detection, when there is no error, the data is transmitted to the host computer without performing error correction again, whereby the number of error corrections can be reduced. Accordingly, the power consumption of the device itself can be reduced.

According to the present invention, in the signal processor described in the first aspect, the data subjected to the predetermined digital signal processing is read from the memory means for each predetermined error correction block, followed by error detection and error correction; when there is some error, the error is corrected by the error correction means for each predetermined error correction block; when there is no error, the data is transmitted to the display means for each predetermined error correction block.

In the signal processor so constructed, the time required for memory access to the memory means can be reduced by terminating the second and more error corrections or reducing the number of error corrections for the data in each predetermined error correction block stored in the memory means, and further high-speed transmission of the data to the host computer is achieved.

BEST MODE TO EXECUTE THE INVENTION

Embodiment 1

Figure 1:
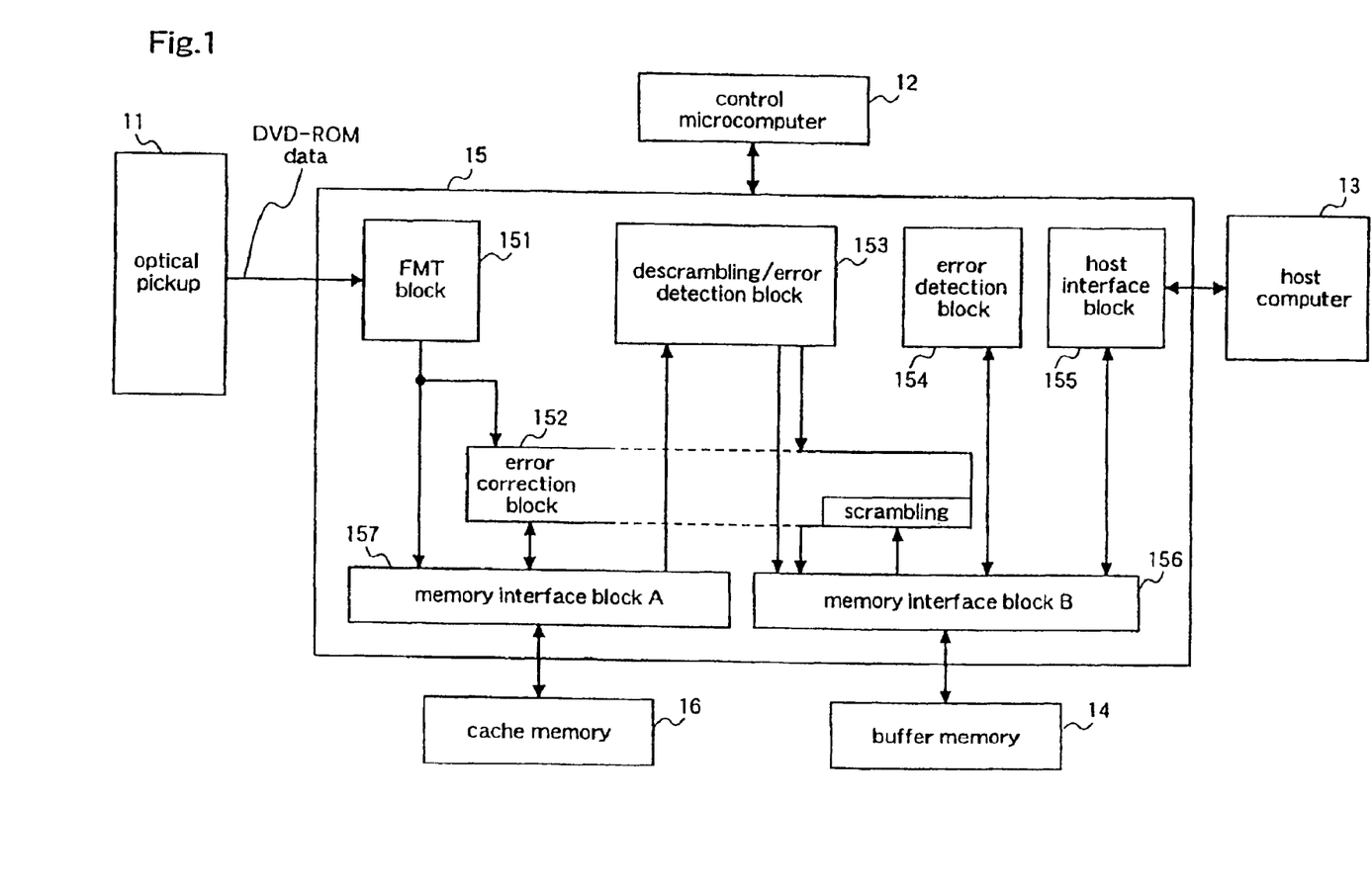
FIG. 1 is a block diagram illustrating the structure of a DVD-ROM signal processor according to a first embodiment of the present invention.

FIG. 1 is a block diagram illustrating the structure of a DVD-ROM signal processor according to a first embodiment of the present invention.

In FIG. 1, a DVD-ROM signal processor 15 receives DVD-ROM digital signal data (hereinafter referred to as "data") which is read by an optical pickup 11, and outputs the data after error correction to a host computer 13. The DVD-ROM signal processor 15 is controlled by a control microprocessor (controller) 12, and the DVD-ROM signal processor 15 is connected to a cache memory 16 for storing the data and to a buffer memory 14 for storing the data stored in the cache memory 16.

To be specific, the DVD-ROM signal processor 15 is provided with an FMT block 151 for capturing the DVD-ROM data outputted from the optical pickup 1; an error correction block 152 for correcting errors in the data stored in the cache memory 16 and the buffer memory 14; a descrambling/error detection block 153 for descrambling the scrambled data, and detecting errors in the descrambled data; an error detection block 154 for detecting errors in the data which has been subjected to error correction and is stored in the buffer memory 14; a host interface block 155 for transmitting error-free data to the host computer 13, based on the result of error detection by the error detection block 154; a memory interface block B 156 for controlling the processing between the DVD-ROM signal processor 15 and the buffer memory 14; and a memory interface block A 157 for controlling the processing between the DVD-ROM signal processor 15 and the cache memory 16.

The operation of the signal processor so constructed will be described with reference to FIGS. 1 and 4.

FIG. 4 is a diagram illustrating the data format constituting one ECC block.

As shown in FIG. 4, the logical format of the DVD-ROM data outputted from the optical pickup 11 is constituted with 182×208 bytes as one ECC block.

First of all, the data read by the optical pickup 11 forms one component unit with 182 bytes as a C1 code word. The C1 code word is composed of 172 bytes of user data and 10 bytes of C1 parity. One ECC block is composed of plural C1 code words and plural C2 code words, each C2 code word having 208 bytes obtained by collecting one byte from each C1 code word. Each C2 code word is composed of 192 bytes of user data and 16 bytes of C2 parity. The DVD-ROM data has been scrambled in advance.

Initially, with reference to FIG. 1, the DVD-ROM data outputted from the optical pickup 11 is converted from serial data to parallel data (serial to parallel conversion) by the FMT block 151. The parallel data are subjected to demodulation and sync detection, and one of the parallel data is written in the cache memory through the memory 16 interface block A 157. At the same time, another one of the parallel data is transmitted for each ECC block to the error correction block 152, wherein it is subjected to error correction. The data which has been subjected to error correction by the error correction block 152 is written in the cache memory 16 through the memory interface block A 157.

Next, the data after error correction is read from the cache memory 16 through the memory interface block A 157, and the scrambled data is subjected to descrambling and error correction by the descrambling/error detection block 153, and the data is transmitted to the buffer memory 14 through the memory interface block B 156. At this time, when the descrambling/error detection block 153 detects some error in the data, error correction is carried out again by the error correction block 152.

The data which has been subjected to error correction by the error correction block 152 is inputted to the error detection block 154 through the buffer memory 14 and the memory interface block B 156, wherein error detection is carried out again. Based on the result of the error detection, only the data decided as "error-free data" is transmitted to the host computer 13 through the host interface block 155.

As described above, in the signal processor according to the first embodiment, the DVD-ROM data inputted to the signal processor is subjected to error detection and error correction for every ECC block. When the data has some error, the data is subjected to error correction for every ECC block. When the data has no error, the data is transmitted to the host computer 13 for every ECC block. Therefore, although in the conventional example error correction is carried out by a predetermined number of times, such wasteful correction work is avoided, and the number of error corrections is reduced. Accordingly, it is possible to reduce the power consumption of the device itself. Further, since the number of memory accesses to the buffer memory 14 for error correction is reduced, the access right to the buffer memory 14 can be assigned to another block, whereby speedup of the signal processor is realized.

Embodiment 2

Figure 2:
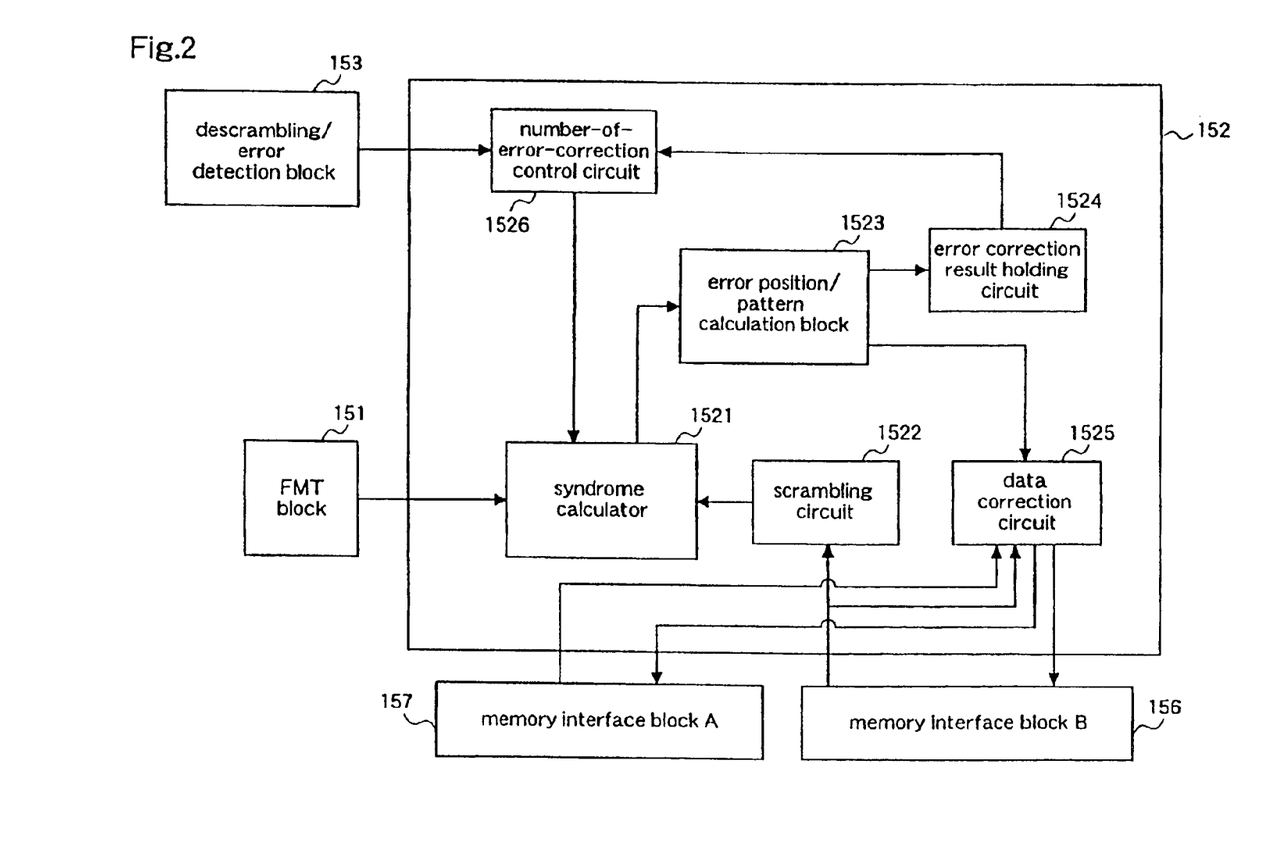
FIG. 2 is a block diagram illustrating the internal structure of an error correction block according to a second embodiment of the present invention.

FIG. 2 is a block diagram illustrating the internal structure of an error correction block according to a second embodiment of the present invention.

With reference to FIG. 2, an error correction block 152 is provided with. a syndrome calculator 1521 for performing syndrome calculation; a scrambling circuit 1522 for scrambling descrambled data; an error position/pattern calculation block 1523 for calculating an error position in data and an error pattern on the basis of the result from the syndrome calculator 1521, and detecting data having uncorrectable errors (hereinafter referred to as "error uncorrectable data"); an error correction result holding circuit 1524 for holding information as to whether there is error uncorrectable data or not, which is detected in the error position/pattern calculation block 1523; data correction circuit 1525 for correcting errors in the data according to the error position and the error pattern calculated from the syndrome by the error position/pattern calculation block 1523; and a number-of-error-correction control circuit 1526 for controlling the number of error corrections.

The operation of the error correction block so constructed will be described with reference to FIG. 2.

Initially, in the above-described first embodiment, the DVD-ROM data transmitted to the error correction block 152 is inputted to the syndrome calculator 1521 for each ECC block, wherein the data is subjected to syndrome calculation. At this time, if there is some error at the point of time when 182 bytes of data equivalent to the C1 code word have been inputted, the result of the syndrome calculation is transmitted to the error position/pattern calculation block 1523, wherein the error position and the error pattern are calculated.

In the error position/pattern calculation block 1523, it is detected whether or not there is any uncorrectable error, and the information about the presence or absence of uncorrectable error is stored in the error correction result holding circuit 1524. The information about the presence or absence of uncorrectable error, which is stored in the error correction result holding circuit 1524, is output to the number-of-error-correction control circuit 1526.

On the other hand, the information about the error position and the error pattern calculated in the error position/pattern calculation block 1523 is transmitted to the data correction circuit 1525. The data correction circuit 1525 reads the data stored in the address indicated by the error position from the cache memory 16 through the memory interface block A 157, and performs error correction by using the error position and the error pattern calculated by the error position/pattern calculation block 1523. The data which has been subjected to error correction by the data correction circuit 1525 is written in the address indicating the error position which is stored in the cache memory, through the memory interface block A 157.

The data which has been subjected to the first error correction in this way is subjected to error detection in the descrambling/error detection block 153, and transmitted to the buffer memory 14 through the memory interface block B 156. At this time, when some error is detected in the descrambling/error detection block 153, error correction is again carried out in the error correction block 152. Hereinafter, this process will be described in more detail.

In FIG. 2, the number-of-error-correction control circuit 1526 decides whether there is any error in the data stored in the buffer memory 14, on the basis of the information from the error correction result holding circuit 1524 and the descrambling/error detection block 153 shown in FIG. 1. Based on the result of the detection, when there is no error, the number-of-error-correction control circuit 1526 outputs the status of "free from error" to the control microcomputer 12. However, when there is some error in the data stored in the buffer memory 14, the number-of-error-correction control circuit 1526 outputs the status of "error" to the control microcomputer 12, and the syndrome calculator 1521 performs syndrome calculation again.

The syndrome calculator 1521 reads the data with the error stored in the buffer memory 14, through the memory interface block B 156. The read data is initially subjected to scrambling by the scrambling circuit 1522, and then converted to the data that can be subjected to syndrome calculation. The converted data is inputted to the syndrome calculator 1521 for each ECC block, and subjected to syndrome calculation. If there is some error at the point of time when 182 bytes of data equivalent to the C1 code word or 208 bytes of data equivalent to the C2 code word have been inputted, the result of the syndrome calculation is transmitted to the error position/pattern calculation block 1523, wherein the error position and the error pattern are calculated.

Next, the information about the calculated error position and error pattern is transmitted to the data correction circuit 1525. The data correction circuit 1525 reads the data in the address indicating the error position from the buffer memory 14 through the memory interface block B 156, and performs error correction by using the error position and the error pattern calculated by the error position/pattern calculation block 1523. Then, the data which have been subjected to error correction in the data error correction circuit 1525 is written in the address indicating the error position of the data stored in the buffer memory 14, through the memory interface block B 156.

As described above, in the signal processor according to the second embodiment, syndrome calculation is performed on the data of each ECC block unit, which is inputted to the error correction block 152, and then error correction is performed on the data of each ECC block unit according to the result of the calculation. Therefore, the number of error corrections can be reduced and, furthermore, the number of memory accesses to the memory means can be reduced. Accordingly, high-speed data processing can be achieved.

Embodiment 3

Figure 3:
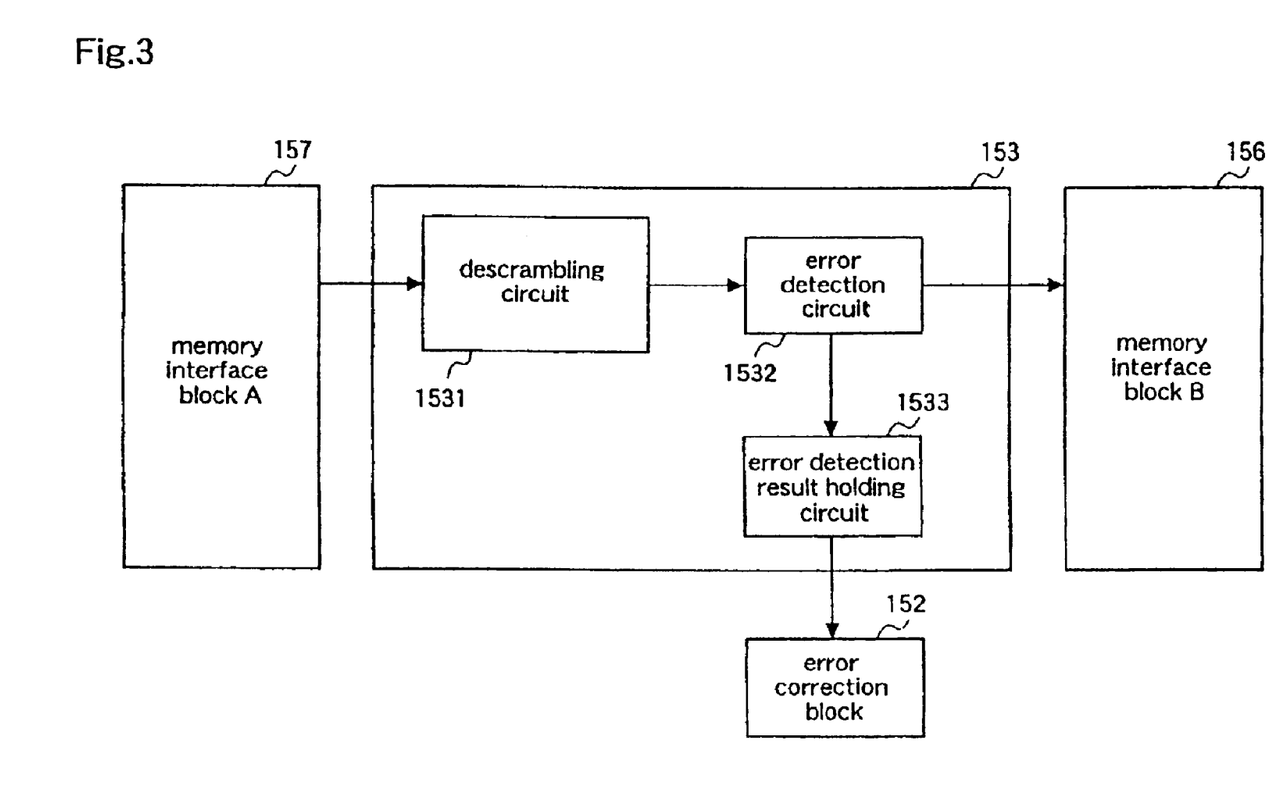
FIG. 3 is a block diagram illustrating the internal structure of a descrambling/error detection block according to a third embodiment of the present invention.

FIG. 3 is a block diagram illustrating the internal structure of a descrambling/error detection block according to a third embodiment of the present invention.

In FIG. 3, a descrambling/error detection block 153 is provided with a descrambling circuit 1531 for descrambling scrambled data; an error detection circuit 1532 for detecting errors in the descrambled data; and an error detection result holding circuit 1533 for holding the result of error detection (presence or absence of error) by the error detection circuit 1532.

The operation of the descrambling/error detection block so constructed will be described with reference to FIG. 3.

Initially, the data which has been subjected to error correction in the error correction block 152 is inputted to the descrambling circuit 1531 from the cache memory 16 through the memory interface block A 157, and the data is descrambled according to a predetermined method. The descrambled data is transmitted to the error detection circuit 1532, wherein errors in the data are detected by a predetermined calculation. The data after the error detection is transmitted to the buffer memory 14 through the memory interface block B 156. Further, information about the result of the error detection by the error detection circuit 1532 is latched in the error detection result holding circuit 1533, and then outputted to the number-of-error-correction control circuit 1526 (see FIG. 2) in the error correction block 152.

As described above, in the signal processor according to the third embodiment, the inputted data is descrambled and then subjected to error detection. Based on the result of the error detection, when there is no error, the data is transmitted to the host computer without performing data correction again. Therefore, the number of error corrections can be reduced, resulting in reduced power consumption of the signal processor.

Embodiment 4

Figure 5:
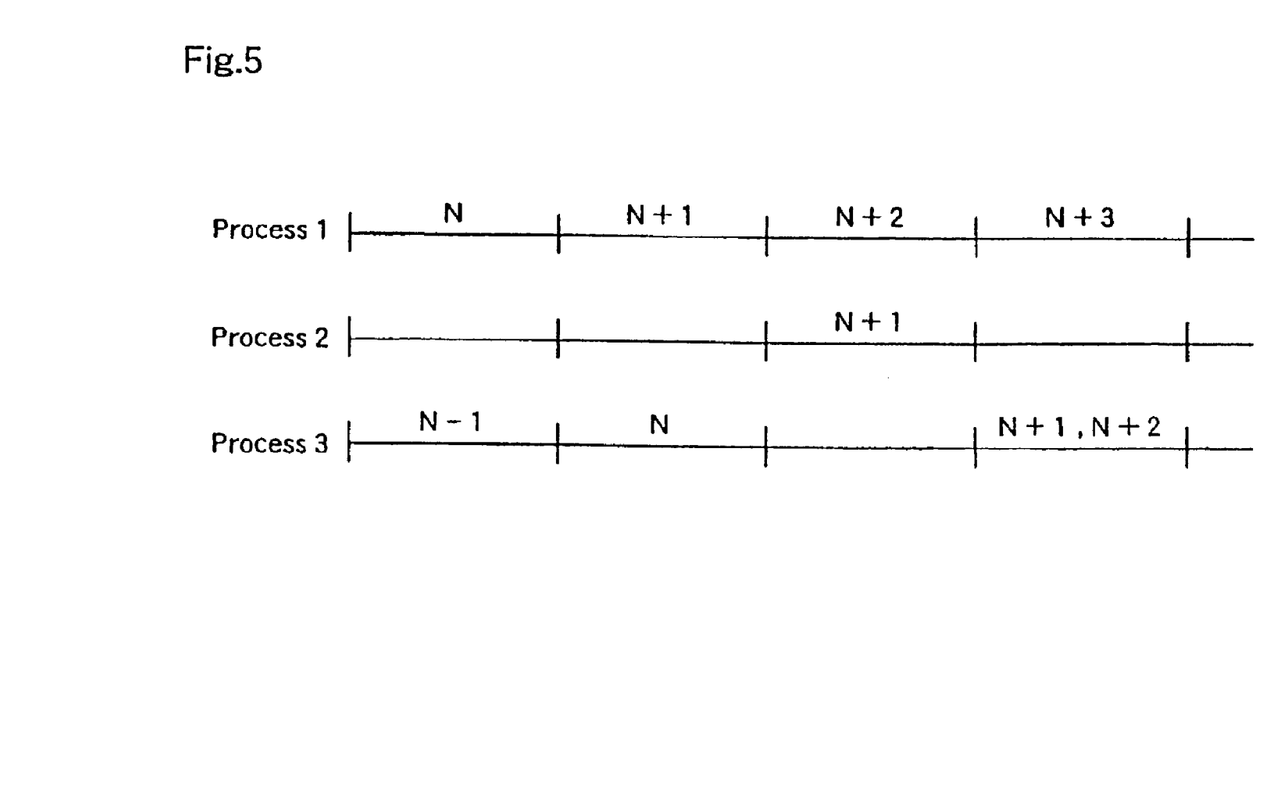
FIG. 5 is a timing chart of memory access in DVD-ROM signal processing according to a fourth embodiment.

FIG. 5 is a timing chart of memory access of a DVD-ROM signal processor according to a fourth embodiment of the present invention.

First of all, each of codes shown in FIG. 5 will be described.

N~N+3 denote block numbers of blocks when the data inputted to the DVD-ROM signal processor is subjected to error correction for each ECC block.

Process 1 denotes the process from when the data inputted to the DVD-ROM signal processor is inputted to the cache memory 16 and the error correction block 152 through the FMT block 151 to when the first error correction is carried out.

Process 2 denotes the process of performing the second and further error correction in the error correction block 152 when the data has some error in Process 1.

Process 3 denotes the process of transmitting error-free data to the host computer 13 through the host interface block 155 when the data has no error.

The operation of the DVD-ROM signal processor so constructed will be described with respect to the timing of memory access, with reference to FIG. 5.

In FIG. 5, for example, the data corresponding to the Nth, (N+2)th, and (N+3)th blocks are constituted by the error-free or error correctable C1 code word while the data corresponding to the (N+1)th block includes the error uncorrectable C1 code word.

Initially, with respect to the data in the Nth, (N+2)th, and (N+3)th blocks, these data having no errors at the point of time when Process 1 is ended are stored in the buffer memory 14. In this case, Process 1 is not followed by Process 2 but followed by Process 3 wherein the error-free data are transmitted for each ECC block to the host computer 13.

On the other hand, with respect to the data in the (N+1)th block, since this data has an error at the point of time when Process 1 is ended, Process 1 is followed by Process 2 wherein the error data is corrected. Those blocks containing the data which are finally decided as "error-free error" are transmitted to the host computer 13 in Process 3.

As described above, according to the signal processor of this fourth embodiment, the DVD-ROM data inputted to the signal processor is processed for every ECC block from when capture of the data is started to when the data is transmitted to the host computer 13. Therefore, in the case where Process 1 is performed on the data corresponding to one ECC block and then Process 3 is performed without performing Process 2 because there is no error, the access time inside the signal processor can be reduced by one ECC block. Accordingly, high-speed transmission of the data to the host computer 13 is realized.

APPLICABILITY IN INDISTORY

As described above, the signal processor according to the present invention can reduce the number of memory accesses by reducing the number of error corrections to process data at higher speed. Especially, it is suitable as a signal processor for which high speed is demanded, such as a DVD-ROM.

What is claimed is:

1. A signal processor for subjecting data read from a recording medium to predetermined digital signal processing, and subjecting the data, which has been subjected to the predetermined digital signal processing, to error correction for each predetermined error correction block, said signal processor comprising:

a first memory operable to sequentially store the data which has been subjected to the predetermined digital signal processing;

a descrambling/error detection unit operable to perform descrambling processing to the data which is stored in said first memory and has been subjected to first error correction, and execute error detection to the data after the descrambling processing;

a second memory operable to sequentially store the data which has been subjected to the descrambling processing;

an error correction unit operable to perform the first error correction to the data stored in said first memory and perform second error correction to the data in said second memory if necessary; and a controller operable to transmit error-free data which has been stored in said second memory to a host computer, wherein, when said descrambling/error detection unit judges that there is an error in the data which has been subjected to the descrambling processing, the data stored in said second memory are read out for each predetermined error correction block, and subjected to error correction by said error correction unit, and when said descrambling/error detection unit judges that there is no error in the data which has been subjected to the descrambling processing, said error correction unit does not perform the second error correction, and said controller transmits the data stored in said second memory to the host computer.

2. A signal processor as described in claim 1, wherein said error correction unit comprises:

a syndrome calculator operable to calculate syndrome of the data which has been subjected to the predetermined digital signal processing;

an error position/pattern calculator operable to calculate an error position and an error pattern after the syndrome calculation;

an error correction result holding unit operable to hold information as to whether or not the data detected by said error position/pattern calculator is error-correctable;

a data correction unit operable to read erroneous data stored in said first memory, correct errors in the data, and store the data which has been subjected to the error correction in said first memory based on the error position and the error pattern calculated by said error position/pattern calculator; and a number-of-error-correction control unit operable to control a number of error corrections.

3. A signal processor as described in claim 1, wherein said descrambling/error detection unit comprises:

a first memory interface operable to read the data stored in said first memory;

a descrambling unit operable to descramble the data after the error correction which has been read from said first memory;

an error detection unit operable to detect errors in the descramble data;

a second memory interface operable to store the descramble data in said second memory; and an error detection result holding unit operable to hold a result of the error detection as to whether is any error in the data which has been subjected to the error detection.

* * * * *